US010305390B2

(12) United States Patent
Lassal (10) Patent No.: US 10,305,390 B2
(45) Date of Patent: May 28, 2019

(54) FILTER CIRCUIT FOR ELIMINATING INRUSH CURRENT, DC COIL CONTROL CIRCUIT, AND ELECTROMAGNETIC CONTACTOR

(71) Applicant: Rockwell Automation Switzerland GmbH, Aarau (CH)

(72) Inventor: Said Lassal, Aarau (CH)

(73) Assignee: Rockwell Automation Switzerland GMBH (CH)

( * ) Notice: Subject to any disclaimer, the term of this patent is extended or adjusted under 35 U.S.C. 154(b) by 0 days.

(21) Appl. No.: 15/599,929

(22) Filed: May 19, 2017

(65) Prior Publication Data

US 2018/0123471 A1    May 3, 2018

(30) Foreign Application Priority Data

Nov. 3, 2016    (EP) ..................... 16197145

(51) Int. Cl.
*H02M 7/06* (2006.01)
*G05F 1/46* (2006.01)
(Continued)

(52) U.S. Cl.
CPC ............ *H02M 7/062* (2013.01); *G05F 1/468* (2013.01); *H01H 47/22* (2013.01);
(Continued)

(58) Field of Classification Search
CPC . H02M 2001/0064; H02M 2001/0003; H02M 3/156; H02M 3/335;
(Continued)

(56) References Cited

U.S. PATENT DOCUMENTS 5,122,724 A    6/1992    Criss
5,886,506 A *  3/1999    Ozawa .................... G05F 1/613
                                                    323/222
(Continued)

FOREIGN PATENT DOCUMENTS

DE    1638288 A1    8/1970
GB    2480239 A     11/2011

OTHER PUBLICATIONS

Extended European Search Report dated Sep. 5, 2017; Application No. 16197145.2—(9) pages.

*Primary Examiner* — Emily P Pham
*Assistant Examiner* — Shahzeb K Ahmad
(74) *Attorney, Agent, or Firm* — Boyle Fredrickson, SC (57) ABSTRACT

The present invention relates to a filter circuit for eliminating capacitive inrush current occurring in electromagnetic coil control circuits controlling the actuator coil of electromagnetic contactors or relays. The filter circuit comprises input terminals to be connected with a direct current voltage, a first output terminal to be connected with a first terminal of the inductive load and a second output terminal to be connected to a second terminal of the inductive load, a first diode, wherein the cathode of the first diode is connected to said first output terminal and to said first input terminal, a second diode, wherein the anode of the second diode is connected to said second output terminal, and a filter capacitor which is connected between said second input terminal and to a node which interconnects the anode of said first diode and the cathode of said second diode.

16 Claims, 5 Drawing Sheets

(51) Int. Cl.
 *H01H 50/02* (2006.01)
 *H01H 50/20* (2006.01)
 *H01H 50/36* (2006.01)
 *H03H 7/01* (2006.01)
 *H01H 47/22* (2006.01)
 *H01H 47/32* (2006.01)
 *H01H 47/36* (2006.01)

(52) U.S. Cl.
 CPC .......... *H01H 47/325* (2013.01); *H01H 47/36* (2013.01); *H01H 50/021* (2013.01); *H01H 50/20* (2013.01); *H01H 50/36* (2013.01); *H03H 7/1766* (2013.01)

(58) Field of Classification Search
 CPC ......... H02M 3/33507; H02M 3/33538; H02M 3/337; H02M 1/126; H02M 1/14; H02M 7/062; H01H 50/021; H01H 50/20; H01H 50/36; G05F 1/468
 See application file for complete search history.

(56) References Cited

U.S. PATENT DOCUMENTS

| | | |
|---|---|---|
| 5,914,849 A | 6/1999 | Perreira |
| 6,060,875 A | 5/2000 | Capici et al. |
| 6,646,842 B2 | 11/2003 | Pan et al. |
| 8,466,661 B2 * | 6/2013 | Helle ............... H02M 1/12 322/100 |
| 8,582,268 B2 | 11/2013 | Yamamoto et al. |
| 8,879,223 B2 * | 11/2014 | Wang ............... H02H 9/045 361/56 |
| 2007/0194769 A1 * | 8/2007 | Yamashita ......... H02M 3/158 323/282 |
| 2008/0165552 A1 * | 7/2008 | Nishi ............... H02M 1/32 363/52 |
| 2009/0080133 A1 | 3/2009 | Chaudhuri et al. |
| 2009/0230771 A1 | 9/2009 | De et al. |
| 2009/0284891 A1 | 11/2009 | Haller |
| 2016/0085255 A1 * | 3/2016 | Gazit ............... H02M 3/158 363/123 |
| 2017/0303353 A1 * | 10/2017 | Guang ............... F21K 9/272 |

* cited by examiner

FILTER CIRCUIT FOR ELIMINATING INRUSH CURRENT, DC COIL CONTROL CIRCUIT, AND ELECTROMAGNETIC CONTACTOR

CROSS-REFERENCE TO RELATED APPLICATIONS

This application claims priority to European Application No. 16197145.2, filed Nov. 3, 2016, the entire contents of which is incorporated herein by reference.

BACKGROUND INFORMATION

The present invention relates to techniques for eliminating capacitive inrush current. More specifically, the present invention relates to a filter circuit for eliminating capacitive inrush current occurring in electromagnetic coil control circuits controlling the actuator coil of electromagnetic contactors or relays.

Electromagnetic contactors and relays are used for electrically controlling switching operations in power circuits. Essentially, conventional electromagnetic contactors are assembled from three primary elements: a contact structure for carrying current, an electromagnetic assembly for providing the force to close the contacts of the contact structure, and a frame housing for enclosing the contact and electromagnetic assembly. Typically, the electromagnetic assembly comprises a movable armature, a fixed core, and an actuator coil that controls the forces applied to the movable armature. In order to control the current that flows through the coil, a control circuit (often called "electronic coil control") is provided inside or outside the contactor.

Figure 4:
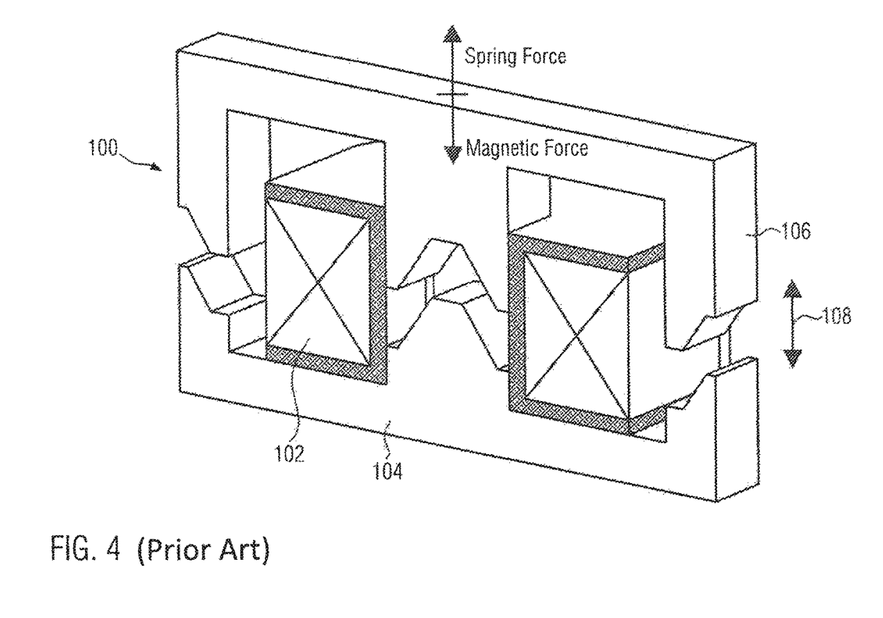
FIG. 4 is a schematic representation of an electromagnetic assembly that can be used together with the DC coil control circuit according to the present invention.

FIG. 4 illustrates such an electromagnetic assembly 100 in a schematic perspective sectional view. According to this example, the actuator coil 102 is arranged at a fixed ferromagnetic core 104. A movable armature 106 is movable along the direction of arrow 108, thereby actuating at least one movable contact (not shown in the Figures). The position of the armature 106 is controlled by the coil current that is flowing in the actuator coil 102. This coil current is controlled by operating a switch which is part of the electronic coil control.

Based on the physical characteristics of the electromagnetic system, the magnetic forces are high when the fixed core 104 and the movable armature 106 are close together. For different reasons, such as for instance energy efficiency, the forces in a closed position are reduced electronically by reducing the electrical power fed to the coil. Conventional electronic coil controls for contactors for instance reduce the power by reducing the duty cycle of a pulse width modulated (PWM) signal that controls the opening and closing of the switch.

Figure 5:
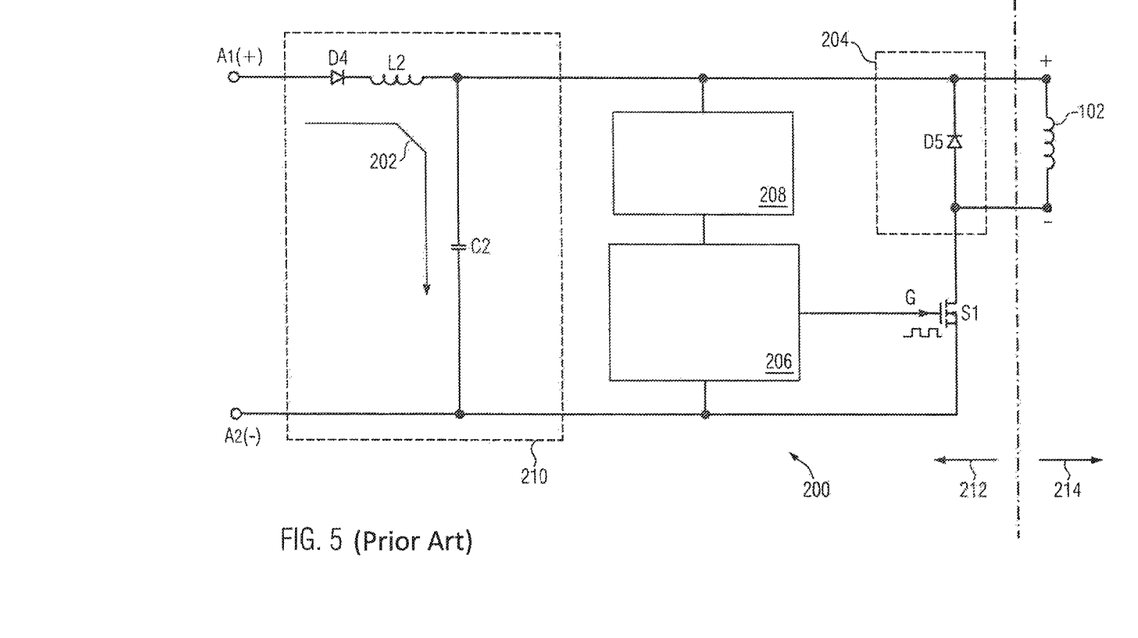
FIG. 5 is a schematic representation of a conventional DC coil control circuit.

FIG. 5 illustrates a conventional electronic coil control 200 that is connected to an electromagnetic DC coil 102 which may be assembled to form an electromagnetic assembly as shown in FIG. 4. The electromagnetic assembly and the electronic circuitry are separate components from a standpoint of circuit logic: In section 212 of FIG. 5, only electronic parts are located, whereas section 214 symbolizes the electromagnetic domain containing the electromagnetic coil 102.

The electronic coil control 200 comprises a first input terminal A1 that can be connected to a positive direct current (DC) supply voltage, and a second input terminal A2 that can be connected to a negative DC supply voltage.

For connecting and disconnecting the coil 102 to/from the DC power supply, a switch S1 is arranged between the coil 102 and the second input terminal A. The switch S1 may for instance be a transistor. The gate terminal G of the transistor is connected to an electronic control unit 206 for controlling the switching of the transistor. Usually, the electronic control unit 206 outputs a pulse width modulated (PWM) signal forming the control signal for controlling the switch S1. For providing a supply voltage to the electronic control unit 206, a supply voltage regulator 208 is connected between the positive input voltage and the electronic control unit 206.

A freewheeling diode D5 is connected in parallel to the coil 102 in order to provide a freewheeling circuit 204.

In order to protect the electronic coil control 200 against conductive emissions, same is equipped with a filter circuit 210 having a filter capacitor C2. However, when the supply voltage is applied, the charging of the filter capacitor C2 during startup generates a high current peak, which is also referred to as inrush current. The inrush current is symbolized by the current path 202 in FIG. 5.

Such current peaks are unfavorable for the upstream equipment and all components of the coil control 200, including the DC power supply device. The inrush current may cause electromagnetic disturbances, can weld contacts, reduce the number of coils that can simultaneously be energized, and subsequently result in reduced operational life, enhanced maintenance cost, and safety issues.

On the other hand, it is known to provide additional inrush current limiting circuits. However, these known circuits add to the costs and complexity of the electronic coil control.

Hence, there exists a need for a technique of limiting inrush currents into inductive loads, in particular into electromagnetic coils that actuate contactors or relays, which is reliable, does not enhance the complexity of the control circuit, and efficiently suppresses inrush currents.

BRIEF DESCRIPTION

The subject matter disclosed herein describes a technique of limiting inrush currents into inductive loads in, particular into electromagnetic coils that actuate contactors or relays, which is reliable, does not enhance the complexity of the control circuit, and efficiently suppresses inrush currents. This object is solved by the subject matter of the independent claims. Advantageous embodiments of the present invention are the subject matter of the dependent claims.

The present invention is based on the idea that the capacitive inrush current during startup can be eliminated by using the actuator coil itself as an input filter connected in series to the input filter capacitor by means of a diode. During startup, the filter capacitor is charged through the actuator coil and the high inductive impedance of the actuator coil avoids the occurrence of an inrush current.

In particular, a filter circuit according to the present invention comprises a first input terminal to be connected with a direct current voltage of a first polarity, and a second input terminal to be connected with a direct current voltage of a second polarity. A first output terminal can be connected with a first terminal of the inductive load and a second output terminal can be connected to a second terminal of the inductive load. A first diode is provided, having an anode and a cathode, wherein the cathode of the first diode is connected to the first output terminal and to said first input terminal. A second diode is provided, having an anode and a cathode, wherein the anode of the second diode is connected to the second output terminal. According to the present invention, a filter capacitor is connected between said second input terminal and to a node which interconnects the anode of said first diode and the cathode of said second diode.

This arrangement has the advantage that by using the electromagnetic actuator coil with its electrical properties as an integral component of the electronic control circuit and by connecting the coil—via a diode—in series to the filter capacitor a complete elimination of the harmful capacitive inrush current can be achieved. Consequently, the number of simultaneously energized coils and the operations per hour can be increased. Advantageously, the number of required components and the costs for parts and assembly can be reduced.

Furthermore, it is clear for a person skilled in the art that the idea according to the present invention can be applied to any scenario where inductive loads have to be electronically controlled, the inductive load being part of the filter circuit instead of an actuator coil.

According to an advantageous embodiment of the present invention, the filter circuit further comprises an RLC filter comprising a parallel connection of an inductor and a series connection of a first resistor and a second filter capacitor, wherein the RLC filter is arranged between said first input terminal and said first output terminal. Such an input filter has the advantage that the input current is smoothed and, moreover, that the output voltage is stabilized.

The present invention further relates to a DC coil control circuit for controlling a current flowing through an actuator coil of an electromagnetic contactor or relay. The DC coil control circuit comprises a first input terminal to be connected with a direct current voltage of a first polarity, and a second input terminal to be connected with a direct current voltage of a second polarity, and a first output terminal to be connected with a first terminal of the actuator coil and a second output terminal to be connected to a second terminal of the actuator coil. A first diode is provided, having an anode and a cathode, wherein the cathode of the first diode is connected to said first output terminal and to said first input terminal. A second diode is provided having an anode and a cathode, wherein the anode of the second diode is connected to said second output terminal. A filter capacitor is connected between said second input terminal and to a first node which interconnects the anode of said first diode and the cathode of said second diode. The DC coil control circuit further comprises a switching device that is connected between said second input terminal and said second output terminal, and has a control input terminal for receiving a control signal that controls opening and closing of the switching device. Further, a control unit is provided which is operable for generating said control signal.

As already mentioned above, the capacitive inrush current can be eliminated by using the high inductive impedance of the electromagnetic DC coil as part of the input filter. Thus, further cost and space consuming electronic components can be dispensed with, while safely avoiding detrimental over current spikes during startup of the DC coil control circuit.

According to an advantageous embodiment of the present invention, the DC coil control circuit further comprises a supply voltage regulator that is connected between said first node and a power supply terminal of said control unit for providing power to the control unit. By using the filter capacitor—which itself is powered through the actuator coil—to feed the electronic control unit, the EMC (electromagnetic compatibility) behavior of the DC coil control circuit can be improved significantly. Moreover, the energy efficiency of the DC coil control circuit can be enhanced.

The DC coil control circuit may further comprise an RLC filter comprising a parallel connection of an inductor and a series connection of a first resistor and a second filter capacitor, wherein the RLC filter is arranged between said first input terminal and said first output terminal. Such an RLC input filter has the advantage that firstly the input current is smoothed. Secondly, the output voltage that is provided at the actuator coil is stabilized. Alternatively, the RLC filter may also be connected with said second input terminal.

According to an advantageous embodiment, the control signal is a pulse width modulated (PWM) signal. The main advantage of using PWM to control the amount of power delivered to a load is that power loss in the switching devices is very low. When a switch is off there is practically no current, and when it is on and power is being transferred to the load, there is almost no voltage drop across the switch. Power loss, being the product of voltage and current, is thus in both cases close to zero. PWM also works well with digital controls, which, because of their on/off nature, can easily set the needed duty cycle.

According to a further embodiment, the DC coil control circuit further comprises a first voltage level detecting resistor that is connected between said first output terminal and said control unit for detecting an input voltage level, wherein the control unit is operable to generate the control signal based on the detected input voltage level. In particular, the working frequency and the duty cycle of the PWM signal can be set in response to the measured input voltage level.

Moreover, a second voltage level detecting resistor may be provided that is connected between said first node and said control unit for detecting a voltage level of said first node, wherein the control unit is operable to determine a pickup voltage and/or a dropout voltage based on the detected voltage level of said first node. These values are defined as follows: The pickup voltage (also defined as "pull in voltage" or "must operate voltage") denotes the value of the coil voltage at or below which all contacts must function when the voltage of a de-energized contactor or relay coil is increased. The dropout voltage (also defined as "release" or "must release voltage") signifies the value at or above which all contacts must return to their de-energized position, as the coil voltage on an energized contactor or relay is decreased. These values are important when certain designs containing the contactor or relay are required to function within a certain voltage range.

The DC coil control circuit according to the present invention may be used to the best advantage with an electromagnetic contactor comprising a movable magnetic core/contact assembly, a coil assembly for magnetically actuating the magnetic core/contact assembly, a fixed magnetic core, and fixed contact elements, wherein the coil assembly is connected with the DC coil control circuit for controlling a current flowing through the coil. Analogously, the DC coil control circuit may also be used for controlling the actuator coil of a relay.

The present invention further relates to a method of actuating an electromagnetic contactor, the electromagnetic contactor comprising a movable magnetic core/contact assembly, a coil assembly for magnetically actuating the magnetic core/contact assembly, a fixed magnetic core, and fixed contact elements, wherein the coil assembly is connected with a DC coil control circuit for controlling a current flowing through the coil, and wherein the method comprises the following steps:

controlling a switch to open and close in response to a control signal, suppressing an inrush current during startup by using the coil as a part of an input filter circuit, the input filter circuit further comprising a first diode having an anode and a cathode, wherein the cathode of the first diode is connected to a first terminal of the coil and to a first DC input terminal, a second diode having an anode and a cathode, wherein the anode of the second diode is connected to a second terminal of the coil, and a filter capacitor which is connected between second DC input terminal and to a node which interconnects the anode of said first diode and the cathode of said second diode.

As set forth above, this way of actuating an electromagnetic DC coil and at the same time incorporating it as an electronic component into the filter circuitry has the advantage of efficiently eliminating the inrush current, at the same time keeping the DC coil control circuit simple, small, and cost efficient.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Figure 1:
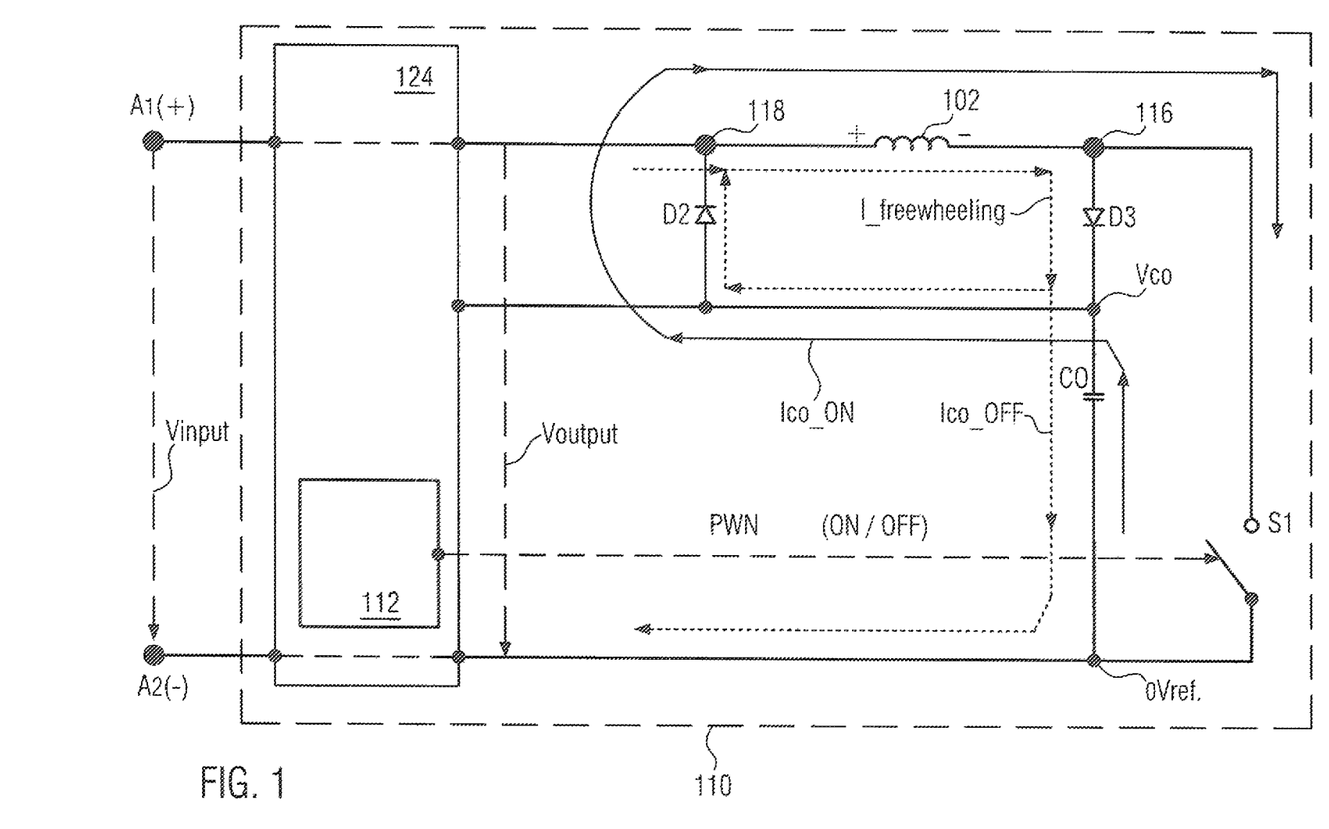
FIG. 1 is a schematic representation of a DC coil control circuit according to a first embodiment of the present invention.

Turning initially to FIG. 1, a schematic representation of a DC coil control circuit 110 according to a first embodiment of the present invention is illustrated. According to the present invention, the electronic functionality of the DC coil control circuit 110 encompasses an actuator coil 102 (also referred to as electromagnetic DC coil in the following) as an integral component of the input filter circuitry. The DC coil control circuit 110 can be connected to a DC voltage supply via a first input terminal A1 and a second input terminal A2. A switch S1 is connected between the negative terminal 116 of the coil 102 and the negative input voltage and is controlled by a control unit 112 in order to control the amount of energy that is fed into the actuator coil 102. Preferably, this switching operation is controlled according to a pulse width modulation (PWM) scheme. As already mentioned above, this has the advantage that the amount of energy that is fed into the coil 102 can easily be controlled on a digital basis.

According to the present invention, a filter capacitor C0 is connected via a diode D3 between the negative terminal 116 of the coil 102 and the negative input voltage. A node Vco between the diode D3 and the capacitor C0 is connected via a diode D2 to a positive terminal 118 of the coil 102. During startup, the filter capacitor C0 is charged through the diode D3 and the electromagnetic DC coil 102, which completely eliminates an inrush current because of the high inductive impedance of the electromagnetic DC coil 102.

The different current paths IC0_ON and IC0_OFF which are active during switching the switch S1 ON and OFF, respectively, are indicated schematically in FIG. 1. When the switch is closed, the current IC0_ON flows through the actuator coil 102, discharges lightly the capacitor C0 and flows mainly through the diode D2. On the other hand, the broken lines indicate that when the switch S1 is opened, a current IC0_OFF flows also through the actuator coil 102 via the diode D3 and recharges the capacitor C0. While this time, all the current flowing through the coil is the freewheeling current I_freewheeling which maintains the both diodes D2 and D3 conducting.

This means that the capacitor C0 gives back the energy to the coil 102 and reduces therefore the input current and the ripple current. Furthermore, because the capacitor C0, the coil 102, and the diode D2 are permanently conducting, the overall electromagnetic compatibility (EMC) behavior of the DC coil control circuit 110 can be improved.

The diodes D2, D3 and the capacitor C0 also form the freewheeling circuit for the electromagnetic DC coil 102.

Because the actuator coil 102 is an integral part of the input filter circuitry, its high inductivity protects the electronic circuit and eliminates the inrush current. As mentioned above, a cost reduction can be achieved because no additional inductors are needed at this point.

Figure 2:
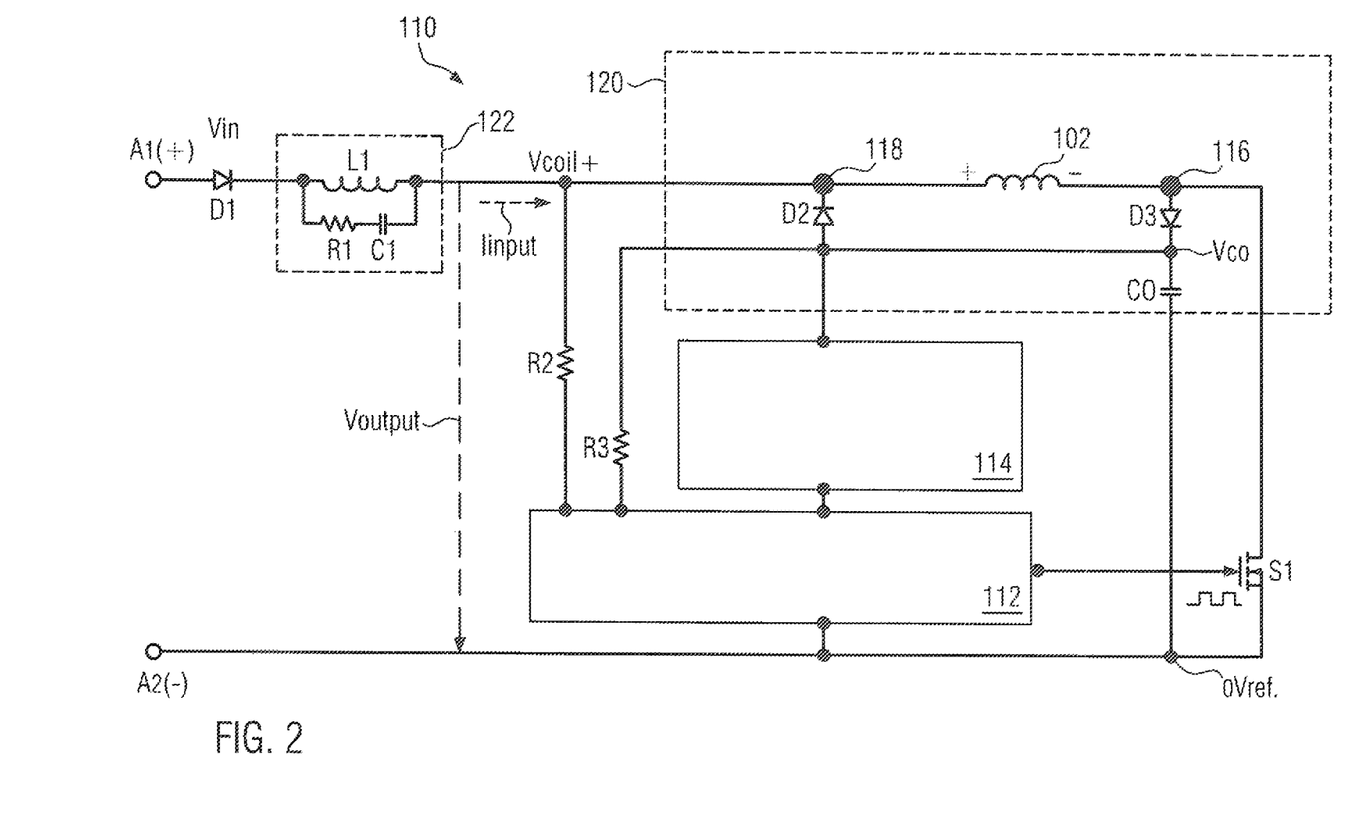
FIG. 2 is a schematic representation of a DC coil control circuit according to a second embodiment of the present invention.

FIG. 2 illustrates a second advantageous embodiment of the DC coil control circuit 110 according to the present invention. Again, the coil 102 is part of an input filter 120. The filter capacitor C0, the actuator coil 102, and the diodes D2 and D3 work in the same way as explained with reference to FIG. 1.

According to the second embodiment, the switch S1 is formed by an, enhancement NMOSFET. However, it is clear for a person skilled in the art that any other suitable switching device, e. g. an IGBT or a relay, may also be employed. The gate terminal of the transistor S1 is connected to the electronic control unit 112. For controlling the current that is flowing through the actuator coil 102, a PWM signal is generated by the electronic control circuit 112.

Furthermore, according to the embodiment shown in FIG. 2, the electronic control circuit 112 is powered by means of a supply voltage regulator 114. The supply voltage regulator 114 is connected with the node Vco between the diodes D2, D3 and the capacitor C0. In this manner, the supply voltage regulator 114 is fed by the filter capacitor C0 which is powered through the electromagnetic DC coil 102 and the diode D3. This ensures a high level of EMC protection to the electronic control unit 112.

Furthermore, and RLC circuit 122 is provided which comprises a parallel connection of an inductor L1 and a series connection of a resistor R1 and capacitor C1. The RLC circuit 122 is functioning as an output voltage stabilizer during a few ms after start up to allow the capacitor C0 to reach its operating voltage as an input filter. After start up, to be active as a filter the capacitor C0 needs to be fully charged at a voltage Vco according to the following equation (1):

$$Vco = (Vcoil) + (VD2) \quad (1)$$

wherein:
VCO signifies the voltage across the capacitor C0,
Vcoil+ signifies the voltage level at the positive terminal 118 of the actuator coil 102, and
VD2 signifies the voltage across the diode D2.

This charging process needs a short time interval. During this time interval, the input RLC circuit 122 act as a stabilizer of the voltage Vcoil+ at the positive terminal 118 of the actuator coil 102.

The DC coil control circuit 110 according to the embodiment shown in FIG. 2 further comprises a resistor R2 for detecting a voltage level of the input voltage Vin and for providing this information to the electronic control unit 112. The electronic control unit 112 determines the working frequency and the duty cycle of the PWM signal based on the detected voltage level Vin.

Furthermore, the node Vco between the diodes D2, D3 and the capacitor C0 is connected to a further resistor R3 that allows the electronic control unit 112 to detect the voltage level at this node. From the detected voltage level, the electronic control unit 112 determines the pickup voltage and the drop out voltage of the contactor or relay.

The electronic control unit is also operable to control the changeover between the pickup operation and the holding operation. As mentioned above, a lower amount of energy has to be fed into the actuator coil 102 after the initial pickup operation and during the long-term holding operation. Any other control operations that are needed for the operation of the contactor or relay may of course also be performed by the electronic control unit 112.

Figure 3:
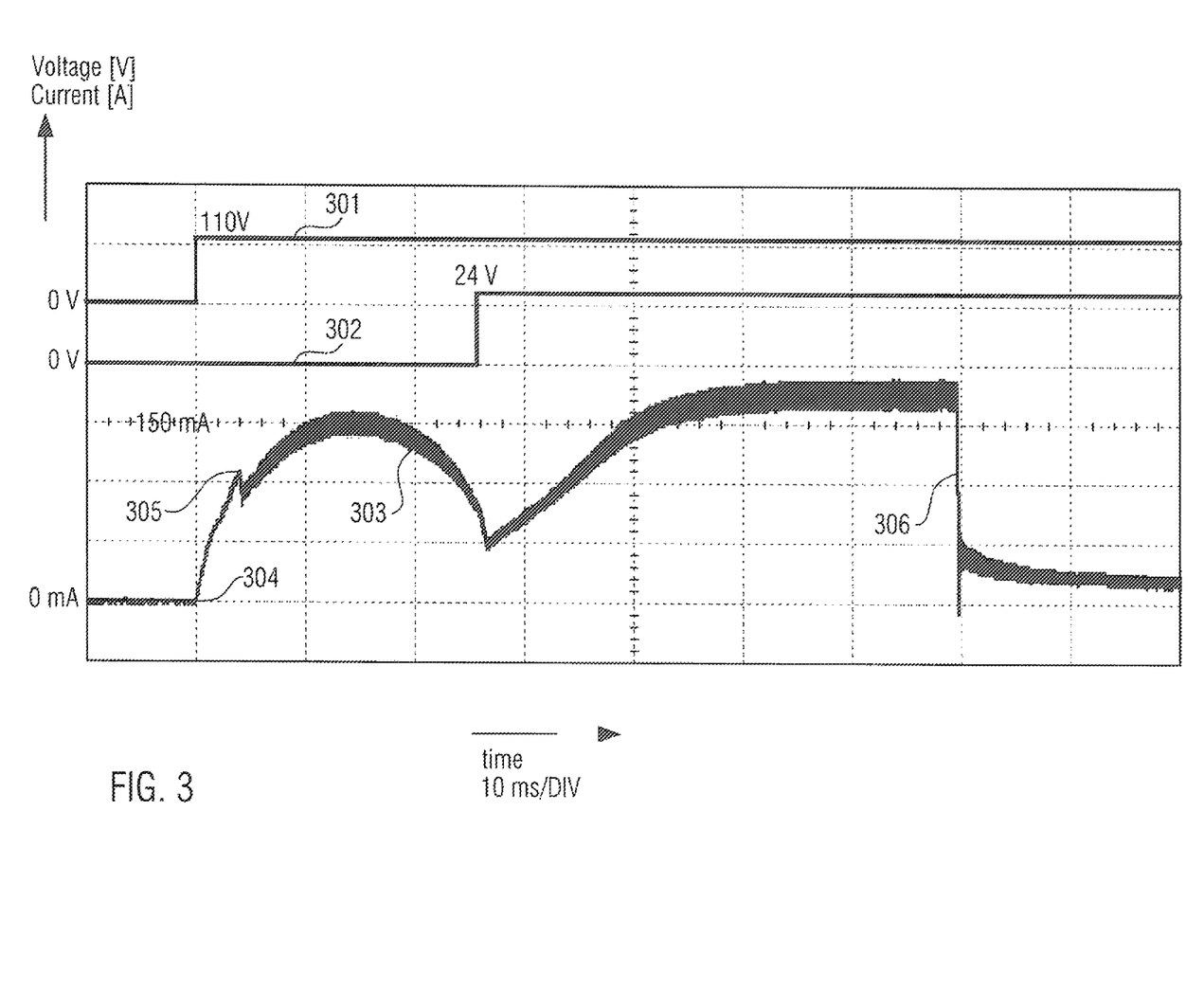
FIG. 3 is a schematic timing diagram showing the input voltage, the switch position of the main contacts, and the input current.

With reference to FIG. 3 the operation of the circuit shown in FIG. 2 will be analyzed in more detail. FIG. 3 shows a schematic timing diagram of the input voltage (shown as curve 301), the state of the main contacts of the contactor (shown as curves 302: 0V: contacts open, 24V: contacts closed), and the input current (shown as curve 303).

In a direction of the timeline, each division signifies 10 ms. In the direction of the voltage and current, for curve 301 each division signifies 100 V. For curve 302 each division signifies 20 V. The scaling of the current curve 303 is 50 mA/division. The input voltage (301) is 110 V DC.

As can be seen from FIG. 3, the pickup time, given by the curve 302, is about 75 ms. Curve 303 indicates that no capacitive inrush current peaks at the beginning of the startup, indicated by point 304, are occurring. Consequently, also no damaging of the electronic components has to be feared. The curve 303 shows two other points. The first point 305 indicates that the voltage of filter capacitor C0 has reached its operating voltage as an input tilter and begins to give back its energy to the coil and reduces the input current. The second point 306 indicates the change over from pickup operation to the holding operation by reducing the input power.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

I claim:

1. A filter circuit for reducing a capacitive inrush current into an inductive load, said filter circuit comprising:
   a first input terminal to be connected with a direct current voltage of a first polarity;
   a second input terminal to be connected with a direct current voltage of a second polarity, wherein the first polarity is positive with respect to the second polarity;
   a first output terminal to be connected with a first terminal of the inductive load;
   a second output terminal to be connected to a second terminal of the inductive load;
   a first diode having an anode and a cathode, wherein the cathode of the first diode is connected to said first output terminal and to said first input terminal and the anode of the first diode is connected to an intermediate node;
   a second diode having an anode and a cathode, wherein the anode of the second diode is connected to said second output terminal and the cathode of the second diode is connected to the intermediate node;
   a filter capacitor which is connected between said second input terminal and the intermediate node, wherein the filter capacitor is changed via the inductive load and the second diode when the direct current voltage is applied across the first input terminal and the second input terminal, such that the inductive load reduces the capacitive inrush current associated with charging the filter capacitor; and
   a switch connected in parallel to the filter capacitor and the second diode between the second input terminal and the second output terminal.

2. The filter circuit of claim 1, further comprising an RLC filter including a parallel connection of an inductor and a series connection of a first resistor and a second filter capacitor, wherein the RLC filter is arranged between said first input terminal and said first output terminal.

3. The filter circuit of claim 1, further comprising an RLC filter including a parallel connection of an inductor and a series connection of a first resistor and a second filter capacitor, wherein the RLC filter is connected with said second input terminal.

4. A DC coil control circuit for controlling a current flowing through an actuator coil of an electromagnetic contactor or relay, wherein the DC coil control circuit comprises:

a first input terminal to be connected with a direct current voltage of a first polarity;

a second input terminal to be connected with a direct current voltage of a second polarity, wherein the first polarity is positive with respect to the second polarity;

a first output terminal to be connected with a first terminal of the actuator coil;

a second output terminal to be connected to a second terminal of the actuator coil;

a first diode having an anode and a cathode, wherein the cathode of the first diode is connected to said first output terminal and to said first input terminal and the anode of the first diode is connected to an intermediate node;

a second diode having an anode and a cathode, wherein the anode of the second diode is connected to said second output terminal and the cathode of the second diode is connected to the intermediate node;

a filter capacitor which is connected between said second input terminal and the intermediate node, wherein the filter capacitor is charged via the actuator coil and the second diode when the direct current voltage is applied across the first input terminal and the second input terminal, such that the actuator coil reduces a capacitive inrush current associated with charging the filter capacitor;

a switching device connected in parallel to the filter capacitor and the second diode between said second input terminal and said second output terminal, the switching device having a control input terminal for receiving a control signal that controls opening and closing of the switching device; and a control unit that is operable for generating said control signal.

5. The DC coil control circuit of claim 4, further comprising a supply voltage regulator that is connected between said intermediate node and a power supply terminal of said control unit for providing power to the control unit.

6. The DC coil control circuit of claim 4, further comprising an RLC filter including a parallel connection of an inductor and a series connection of a first resistor and a second filter capacitor, wherein the RLC filter is arranged between said first input terminal and said first output terminal.

7. The DC coil control circuit of claim 6, further comprising an input diode with an anode and a cathode, wherein the anode is connected to said first input terminal and the cathode is connected to said RLC filter.

8. The DC coil control circuit of claim 4, wherein said control signal is a pulse width modulated (PWM) signal.

9. The DC coil control circuit of claim 4, further comprising a voltage level detecting resistor connected between said first output terminal and said control unit for detecting an input voltage level, wherein the control unit is operable to generate the control signal based on the detected input voltage level.

10. The DC coil control circuit of claim 4, further comprising a voltage level detecting resistor that is connected between said intermediate node and said control unit for detecting a voltage level of said intermediate node, wherein the control unit is operable to determine at least one of a pickup voltage and a dropout voltage based on the detected voltage level of said intermediate node.

11. The DC coil control circuit of claim 4, further comprising an electromagnetic contactor including:
a movable magnetic core assembly,
a coil assembly for magnetically actuating the magnetic core assembly,
a fixed magnetic core, and
at least one fixed contact element, wherein the coil assembly is connected between the first and second output terminals for controlling a current flowing through the coil assembly.

12. A method of actuating an electromagnetic contactor, the electromagnetic contactor including a movable magnetic core assembly, an actuator coil for magnetically actuating the magnetic core assembly, a fixed magnetic core, and at least one fixed contact element, wherein the actuator coil is connected with a DC coil control circuit for controlling a current flowing through the actuator coil, the method comprising the steps of:
controlling a switch to open and close in response to a control signal; and
suppressing a capacitive inrush current during startup by using the actuator coil as a part of an input filter circuit, wherein:
the input filter circuit includes a first diode having an anode and a cathode, wherein the cathode of the first diode is connected to a first terminal of the actuator coil and to a first DC input terminal and the anode of the first diode is connected to an intermediate node,
a second diode having an anode and a cathode, wherein the anode of the second diode is connected to a second terminal of the actuator coil and the cathode of the second diode is connected to the intermediate node,
a filter capacitor which is connected between a second DC input terminal and the intermediate node wherein a polarity of DC voltage present at the first DC input terminal is positive with respect to a polarity of DC voltage present at the second DC input terminal, and
the switch is connected in parallel to the filter capacitor and the second diode between the second DC input terminal and the second terminal of the actuator coil.

13. The method of claim 12, wherein a control unit is operable for generating said control signal, and wherein the control unit is powered by a current flowing through said actuator coil.

14. The method of claim 12, further comprising the step of stabilizing a voltage across the actuator coil with an RLC filter including a parallel connection of an inductor and a series connection of a first resistor and a second filter capacitor, wherein the RLC filter is arranged between said first input terminal and said first output terminal.

15. The method of claim 12, further comprising the steps of:
monitoring a voltage level at said intermediate node; and
determining at least one of a pickup voltage level and a dropout voltage level of the contactor based on the voltage level at said intermediate node.

16. The method of claim 12, further comprising the steps of:
monitoring a voltage level at said first terminal of the coil; and
determining a working frequency and a duty cycle of a PWM signal that is used as said control signal.

* * * * *